(12) United States Patent
Fu et al.

(10) Patent No.: US 12,243,816 B2
(45) Date of Patent: Mar. 4, 2025

(54) SEMICONDUCTOR STRUCTURE HAVBING AN ENHANCED E-FUSE AND A METHOD MAKING THE SAME

(71) Applicant: Taiwan Semiconductor Manufacturing Co., Ltd., Hsin-Chu (TW)

(72) Inventors: An-Jiao Fu, Hsinchu (TW); Po-Hsiang Huang, Taipei (TW); Derek Hsu, Hsinchu (TW); Hsiu-Wen Hsueh, Taichung (TW); Meng-Sheng Chang, Hsinchu County (TW)

(73) Assignee: TAIWAN SEMICONDUCTOR MANUFACTURING CO., LTD, Hsinchu (TW)

( * ) Notice: Subject to any disclaimer, the term of this patent is extended or adjusted under 35 U.S.C. 154(b) by 282 days.

(21) Appl. No.: 17/875,042

(22) Filed: Jul. 27, 2022

(65) Prior Publication Data

US 2022/0375859 A1    Nov. 24, 2022

Related U.S. Application Data

(62) Division of application No. 16/938,450, filed on Jul. 24, 2020, now Pat. No. 11,410,926.

(60) Provisional application No. 62/906,144, filed on Sep. 26, 2019.

(51) Int. Cl.
*H01L 23/525* (2006.01)
*H01L 21/768* (2006.01)
*H01L 23/00* (2006.01)
*H01L 23/485* (2006.01)

(52) U.S. Cl.
CPC ...... *H01L 23/5256* (2013.01); *H01L 21/7684* (2013.01); *H01L 23/485* (2013.01); *H01L 24/03* (2013.01); *H01L 2221/1068* (2013.01)

(58) Field of Classification Search
CPC ... H01L 23/62; H01L 23/5256; H01L 23/485; H01L 2224/0311; H01L 2224/11011; H01L 2224/27011
See application file for complete search history.

(56) References Cited

U.S. PATENT DOCUMENTS 6,864,124 B2 * 3/2005 Lee .................. H01L 23/5258
257/E23.15
2015/0001592 A1 * 1/2015 Lai .................. H01L 21/0217
257/288

* cited by examiner

*Primary Examiner* — Laura M Menz
*Assistant Examiner* — Candice Chan
(74) *Attorney, Agent, or Firm* — HAYNES AND BOONE, LLP (57) ABSTRACT

In the present disclosure, a semiconductor structure includes an Mx-1 layer including a first dielectric layer and first metal features, wherein the first metal features include a first set of first metal features in a first region and a second set of first metal features in a second region, wherein the first set has a first pattern density and the second set has a second pattern density being greater than the first pattern density. The structure further includes a Vx layer disposed over the Mx-1 layer, the Vx layer including first vias contacting the first set of the first metal features. The structure further includes an Mx layer disposed over the Vx layer, the Mx layer including a fuse element, wherein the fuse element has a first thickness in the first region less than a second thickness in the second region.

20 Claims, 5 Drawing Sheets

SEMICONDUCTOR STRUCTURE HAVBING AN ENHANCED E-FUSE AND A METHOD MAKING THE SAME

PRIORITY DATA

This application is a Divisional of U.S. patent application Ser. No. 16/938,450, filed Jul. 24, 2020, which further claims the benefit of U.S. Provisional Application No. 62/906,144, entitled "E-Fuse Enhancement by Underlayer Layout Design," filed Sep. 26, 2019, the entire disclosures of which are incorporated herein by reference.

TECHNICAL FIELD

The disclosure relates generally to a fuse structure and method of forming the fuse structure and, more particularly, to an electrical fuse in a semiconductor device and method of forming the electrical fuse.

BACKGROUND

In the semiconductor industry, fuse elements are widely used features in integrated circuits for a variety of purposes, such as in memory repair, analog resistor trimming, and chip identification. For example, by replacing defective memory cells on chips with redundant cells on the same chips, memory manufacturing yields can be significantly increased. A fuse disconnected by a laser beam is referred to as a laser fuse, and a fuse disconnected by passing an electrical current, or blowing, is referred to as an electrical fuse, or e-fuse. By selectively blowing fuses within an integrated circuit that has multiple potential uses, a generic integrated circuit design may be economically manufactured and adapted to a variety of custom uses.

E-fuses may be incorporated in the design of integrated circuits, wherein the fuses are selectively blown, for example, by passing an electrical current of a sufficient magnitude to cause electro-migration or melting of a fuse link, thereby creating a more resistive path or an open circuit. In some applications, cross-sectional area of fuse element (i.e., width of fuse element) can be adjusted to change current density through fuse element and thus change current need to blow fuse. Existing e-fuse designs have lacked adjustment of fuse element thickness since fuse element is formed in metallization layer of the device. Accordingly, there is a need for an underlayer layout design for e-fuse structures to overcome the deficiencies of the prior art.

BRIEF DESCRIPTION OF THE DRAWINGS

For a more complete understanding of the present embodiments, and the advantages thereof, reference is now made to the following descriptions taken in conjunction with the accompanying drawings, in which.

DETAILED DESCRIPTION OF ILLUSTRATIVE EMBODIMENTS

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The apparatus may be otherwise oriented (rotated 90 degrees or at other orientations) and the spatially relative descriptors used herein may likewise be interpreted accordingly.

The making and using of the present embodiments are discussed in detail below. It should be appreciated, however, that this disclosure provides many applicable inventive concepts that can be embodied in a wide variety of specific contexts. The specific embodiments discussed are merely illustrative of specific ways to make and use the invention, and do not limit the scope of the invention.

Embodiments will be described with respect to an electrical fuse structure in a semiconductor chip. Other embodiments contemplate applications where the use of an electrical fuse structure is desirable.

Figure 1A:
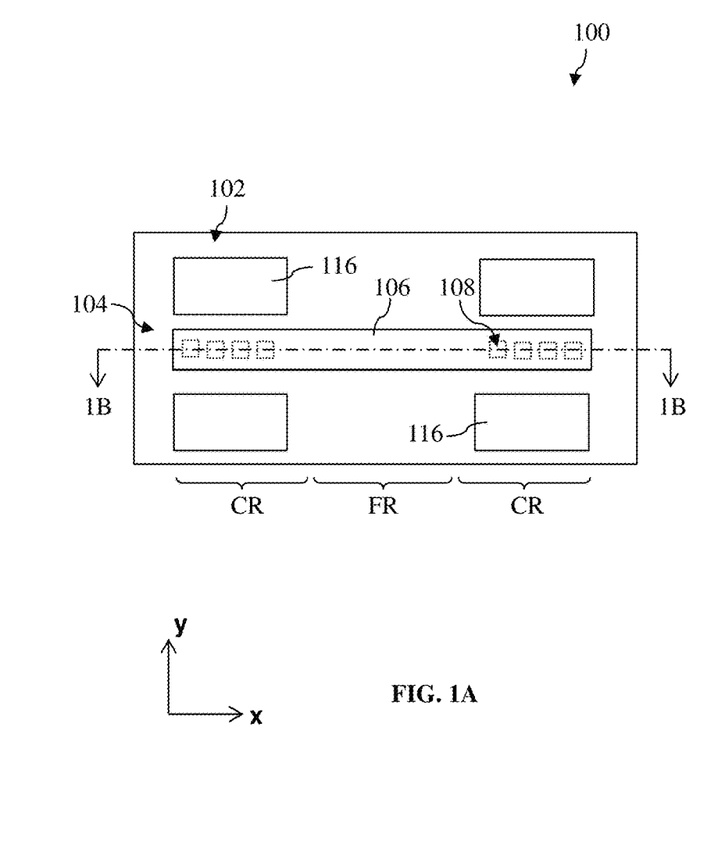
FIG. 1A is a top view of electrical fuse structure in accordance with an embodiment.

FIG. 1A depicts a semiconductor structure 100 having a base layer 102. The base layer 102 may include one or more layers such as a semiconductor substrate, contact etch stop layer, inter-layer dielectric layers, conductive layers, and interconnect layers in the semiconductor structure 100. The semiconductor substrate may include a single or compound semiconductor substrate having active devices such as transistors formed therein. The substrate may be formed of silicon, silicon-germanium, or the like.

The semiconductor substrate may alternatively be made of some other suitable elementary semiconductor, such as diamond or germanium; a suitable compound semiconductor, such as silicon germanium, silicon carbide, gallium arsenic, indium arsenide, or indium phosphide; or a suitable alloy semiconductor, such as silicon germanium carbide, gallium arsenic phosphide, or gallium indium phosphide.

The semiconductor substrate may also include various doped regions such as n-wells and p-wells. In some embodiments, the semiconductor substrate may include a buried dielectric material layer for isolation formed by a proper technology, such as a technology referred to as separation by implanted oxygen (SIMOX).

The semiconductor substrate may be uniform in composition or may include various layers. The layers may have similar or different compositions, and in various embodiments, some layers have non-uniform compositions to induce device strain and thereby tune device performance. The semiconductor substrate may include an epitaxial layer formed on the top surface, such as an epitaxial semiconductor layer overlying a bulk semiconductor wafer. In various embodiments, the semiconductor substrate includes one or more epitaxially grown semiconductor material. For example, a silicon layer is epitaxially grown on a silicon wafer. In another example, a silicon germanium layer is epitaxially grown on a silicon wafer. In yet another example, silicon and silicon germanium are alternatively epitaxially grown on a silicon wafer. In some embodiments, suitable deposition processes for epitaxy growth include atomic layer deposition (ALD), chemical vapor deposition (CVD), high-density plasma CVD (HDP-CVD), physical vapor deposition (PVD) and/or other suitable deposition processes. Any of these techniques may be used to grow the semiconductor layer having any composition including a graded composition.

The semiconductor structure 100 may also include a fuse structure 104 including a fuse element 106 at least partially disposed in a fuse region FR connecting contact pads or plugs 108 at least partially disposed in contact regions CR. As used herein, fuse region FR and contact regions CR may refer only to regions of the fuse structure 104 and not to specific elements within the fuse structure 104. In some other embodiments, the fuse region FR may refer specifically to the fuse element 106. The fuse structure 104 may be formed of a metal, such as copper or the like, or silicided polysilicon, such as nickel silicide (NiSi), titanium silicide ($TiSi_2$), cobalt silicide ($CoSi_x$), platinum silicide ($PtSi_2$), or the like. The contact pads 108 may be formed of copper, tungsten, or metals or the like, and may also comprise a diffusion barrier layer lining the contact pads 108 formed of, for example, TiN, TaN, or the like. In some embodiments, the fuse element 106 has a width much greater than a width of the contact pads 108. In one or more embodiments, the contact pads 108 may include one or more via structures having metal plugs filled therein. The semiconductor structure 100 may additionally include dummy conductive features 116 disposed on the sides of the fuse element 106 to constrain the formation of the fuse element 106 for fabrication enhancement including better pattern density and pattern geometry. The fuse element 106 and the dummy conductive features 116 are simultaneously formed, such as with metal lines in a same metal layer ($M_x$). Accordingly, the fuse element 106 and the dummy conductive features 116 are at a same level and include same conductive materials, such as copper, aluminum, other suitable conductive materials, or a combination thereof.

Figure 1B:
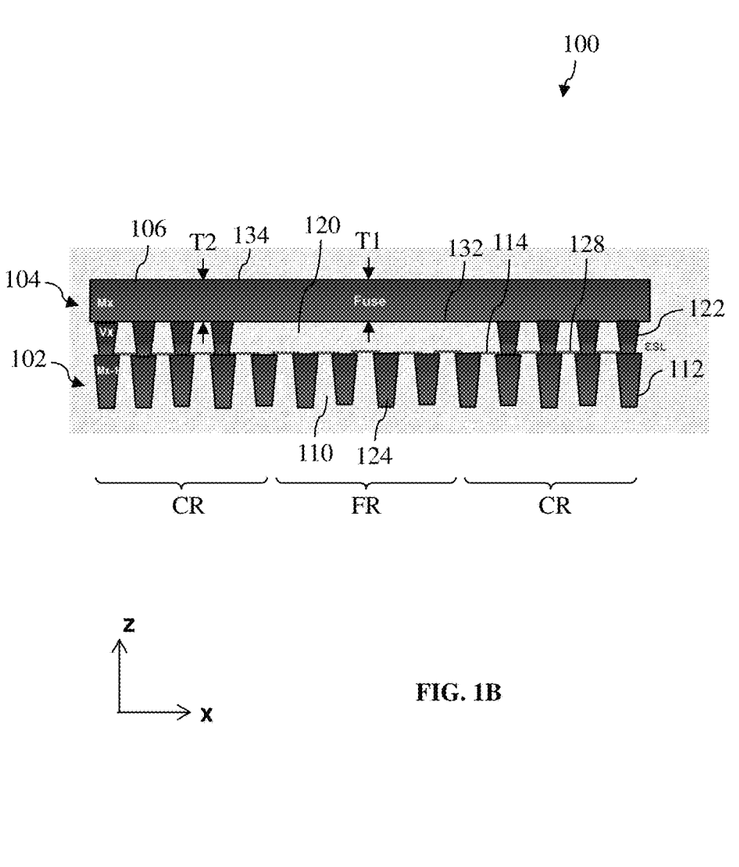
FIG. 1B is a section view along line 1B of the e-fuse of FIG. 1A.

FIG. 1B is a section view along line 1B of the semiconductor structure 100 of FIG. 1A. As shown in FIG. 1B, the base layer 102 includes a first ILD layer 110 having metal features 112 formed in the contact regions CR and dummy pattern metal features 124 formed in the fuse region FR.

In some embodiments, the first ILD layer 110 may be formed of silicon dioxide, silicon nitride, silicon oxynitride, or the like. In some implementations, the first ILD layer 110 may include any suitable dielectric material, such as a semiconductor oxide, a semiconductor nitride, a semiconductor oxynitride, other suitable dielectric materials, or combinations thereof. In some embodiments, the first ILD layer 110 includes a low-k dielectric material (with a dielectric constant less than that of silicon oxide). The formation of the first ILD layer 110 may include deposition and chemical mechanical polishing (CMP) to provide a planarized top surface 128.

In some embodiments, the metal features 112 and the dummy pattern metal features 124 may be formed of any suitable conductive material, such as Cu, Co, Ru, W, Mo, Ni, Cr, Jr, Pt, Rh, Ta, Ti, Al, TaN, TiN, compounds, or other suitable conductive materials, or combinations thereof. In some embodiments, the metal features 112 and the dummy pattern metal features 124 may be deposited using PVD, CVD, ALD, electroplating, ELD, or other suitable deposition process, or combinations thereof.

It will be appreciated that the metal features 112 may form an Mx-1 layer. As illustrated in FIG. 1B, the metal features 112 may be aligned along the x-direction. In other words, a height in the z-direction of a top surface 128 and a bottom surface of a first metal feature 112 may be about equal to a height in the z-direction of top surfaces 128 and bottom surfaces of each other metal feature 112. Likewise, the dummy pattern metal features 124 may also be aligned along the x-direction. In some embodiments, the dummy pattern metal features 124 may include a line width, line spacing and pattern density about equal to a line width, line spacing and pattern density of the metal features 112. In such embodiments, a duty ratio of the fuse region FR may be about equal to a duty ratio of the contact regions CR. The duty ratio is defined as a ratio of a pattern size to a distance between adjacent patterns. In other words, the duty ratio is defined as a ratio of the line width over the pitch of the metal lines. In such embodiments, a CMP dishing effect may be about equal between the fuse region FR and the contact regions CR. In other words, the metal features 112 and the dummy pattern metal features 124 may have about equal recess depth after CMP, regardless of dishing, so that the resulting fuse element 106 includes a uniform starting depth, or flat bottom surface 132, and a uniform thickness in the fuse region FR and in the contact regions CR.

In some embodiments, an etch stop layer 114 may be formed on top surfaces 128 of the first ILD layer 110, metal features 112, and dummy pattern metal features 124. The fuse structure 104 may include a second ILD layer 120 formed over the Mx-1 layer. The second ILD layer 120 may incorporate materials and methods related to the first ILD layer 110 without limitation. As illustrated in FIG. 1B, the second ILD layer 120 may conform to top surfaces 128 of the metal features 112. The fuse structure 104 may be formed on the etch stop layer 114. The contact pads 108 may include vias 122 formed in the second ILD layer 120. As used herein, vias 122 may include via trench structures having metal plugs filled therein. The vias 122 may be in electrical contact with the metal features 112 of the Mx-1 layer. It will be appreciated that the vias 122 may form a Vx layer.

In some embodiments, the etch stop layer 114 may be formed of SiC, LaO, A10, AlON, ZrO, HfO, SiN, Si, ZnO, ZrN, ZrAlO, TiO, TaO, YO, TaCN, ZrSi, SiOCN, SiOC, SiCN, HfSi, LaO, SiO, or combinations thereof. In some embodiments, the etch stop layer 114 may be deposited by plasma-enhanced CVD (PECVD), or other suitable deposition processes. In some embodiments, the vias 122 may be formed of a conductive material including metal and may include aluminum, copper, aluminum/silicon/copper alloy, cobalt, nickel, titanium, tungsten, platinum, ruthenium, silver, gold, rhodium, molybdenum, cadmium, zinc and alloys, compounds, or combinations thereof.

The vias 122 may be formed by any suitable deposition method, such as PVD, CVD, ALD, plating (e.g. electroplating), or combinations thereof. In some embodiments, the vias 122 may include a barrier layer. The barrier layer may include an electrically conductive material such as titanium (Ti), titanium nitride (TiN), tantalum (Ta), tantalum nitride (TaN), or the like, and may be formed using a CVD process, such as PECVD. In some embodiments, the vias 122 may include a seed layer. The seed layer may be deposited by PVD, ALD, or CVD, and may be formed of tungsten, copper, or copper alloys. In some embodiments, the vias 122 may be deposited on the seed layer.

The fuse structure 104 may also include a fuse element 106 formed over the Vx layer. The fuse element 106 may be in electrical contact with the vias 122 of the Vx layer. It will be appreciated that the fuse element 106 may form an Mx layer. As illustrated in FIG. 1B, the fuse element 106 may conform to top surfaces 132 of the second ILD layer 120 and the vias 122. In one or more embodiments, the fuse element 106 may extend lengthwise in the x-direction. In some embodiments, along the y-direction, the fuse element 106 may have a first width in the contact regions CR greater than a second width in the fuse region FR. In one or more embodiments, the fuse element 106 may have a constant thickness in the z-direction. Therefore, as illustrated, a thickness T1 in the fuse region FR may be about equal to a thickness T2 in the contact regions CR. In some embodiments, an overall metal thickness of the fuse element 106 may be increased relative to conventional fuse structures. In some embodiments, a local metal thickness, such as the thickness T1, may be increased relative to conventional fuse structures. In some embodiments, a thickness, width, and length of the fuse element 106 may scale according to scaling of integrated circuit critical dimensions. In some embodiments, increased overall metal thickness of the fuse element 106 or increased local metal thickness of the fuse element 106 in the fuse region FR may provide increased current and/or increased current density through the fuse region FR relative to conventional fuse structures, which may result in easier burn out of the fuse element 106 compared to conventional fuse structures having relatively decreased metal thickness, such as a conventional fuse structure without dummy pattern metal features 124 inserted in the fuse region. In some examples, the conventional fuse structure includes a concave bottom surface in the fuse region, causing the fuse element thinner in the fuse region. In some embodiments without the vias 122, the fuse element 106 may more readily blow or burn out in the contact regions CR compared to the fuse region FR. However, in the embodiment illustrated which includes the vias 122, the fuse element 106 may more readily burn out in the fuse region FR compared to the contact regions CR.

Figure 2A:
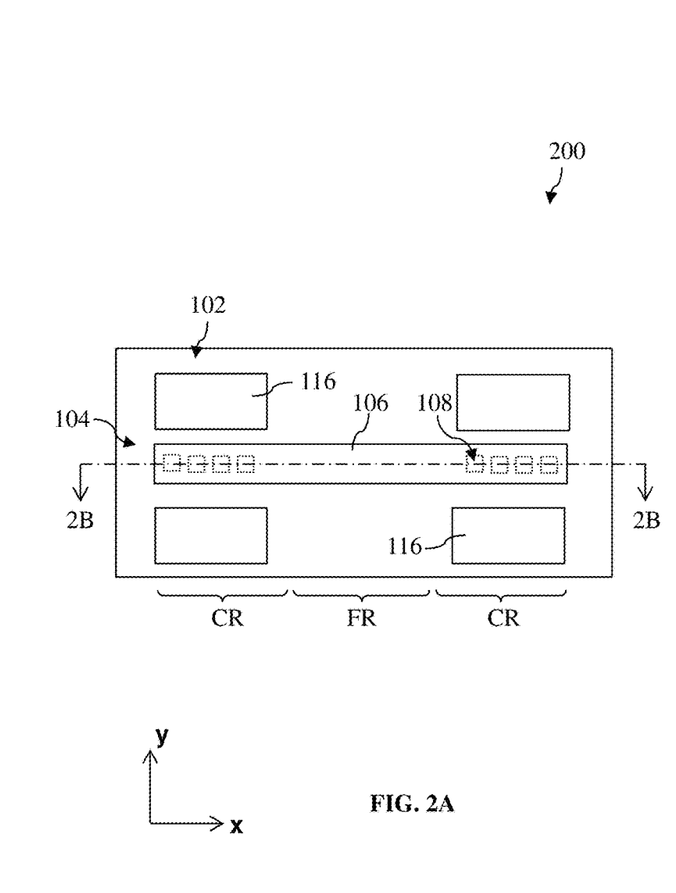
FIG. 2A is an electrical fuse structure in accordance with another embodiment.

FIG. 2A depicts a semiconductor structure 200 in accordance with another embodiment. The semiconductor structure 200 may incorporate like structures from semiconductor structure 100 without limitation.

The semiconductor structure 200 includes dummy pattern metal features 126. In some embodiments, the dummy pattern metal features 126 may be formed of any suitable conductive material, such as Cu, Co, Ru, W, Mo, Ni, Cr, Ir, Pt, Rh, Ta, Ti, Al, TaN, TiN, compounds, or other suitable conductive materials, or combinations thereof. In some embodiments, the dummy pattern metal features 126 may be deposited using PVD, CVD, ALD, electroplating, ELD, or other suitable deposition process, or combinations thereof.

In some embodiments, the dummy pattern metal features 126 may include a line width greater than the line width of the metal features 112 and the dummy pattern metal features 124. In some embodiments, the dummy pattern metal features 126 may include a pattern density greater than the pattern density of the metal features 112 and the dummy pattern metal features 124. In some embodiments, the dummy pattern metal features 126 may include line width, line spacing and pattern density greater than the line width, line spacing and pattern density of the metal features 112 and the dummy pattern metal features 124. In some embodiments, at least a subset of the line width, line spacing and pattern density of the dummy pattern metal features 126 is greater than the subset of the line width, line spacing and pattern density of the metal features 112 and the dummy pattern metal features 124. For examples, the line spacing and pattern density of the dummy pattern metal features 126 are greater than the line spacing and pattern density of the metal features 112 and the dummy pattern metal features 124. In such embodiments, a duty ratio Df of the fuse region FR is greater than a duty ratio Dc of the contact regions CR, or Df/Dc being greater than 1. In some examples, Df/Dc ranges between 1.5 and 2. When the ratio Df/Dc is not greater enough, the corresponding dishing effect is not significant to cause enough height difference to effectively increase current density. When the ratio Df/Dc is too larger, the dummy metal features 126 would be too close or even be congregated together, causing undesired stress and delamination issue. The ratio Df/Dc is tuned to enhance the current density without causing other concern, such as delamination. A semiconductor structure 200 including the Mx-1 layer according to any of the foregoing embodiments, either having greater line width, greater line spacing, greater pattern density, or greater line width, greater line spacing and greater pattern density in the fuse region FR, may alter a loading effect so that a CMP dishing effect is increased in the fuse region FR compared to the contact regions CR. In such embodiments, the CMP dishing effect may be greater in the fuse region FR than in the contact regions CR. In other words, top surfaces 128 of the metal features 112 may have a greater height in the z-direction than top surfaces 130 of the dummy pattern metal features 126 after CMP. That is, the dummy pattern metal features 126 may include a greater recess depth than the metal features 112 due to greater recessing of the dummy pattern metal features 126 in the fuse region FR. In some embodiments, the resulting fuse element 106 may include a non-uniform starting depth, or curved bottom surface 132, and a non-uniform thickness in the fuse region FR compared to the contact regions CR. In some embodiments, the resulting fuse element 106 includes a convex bottom surface.

Figure 2B:
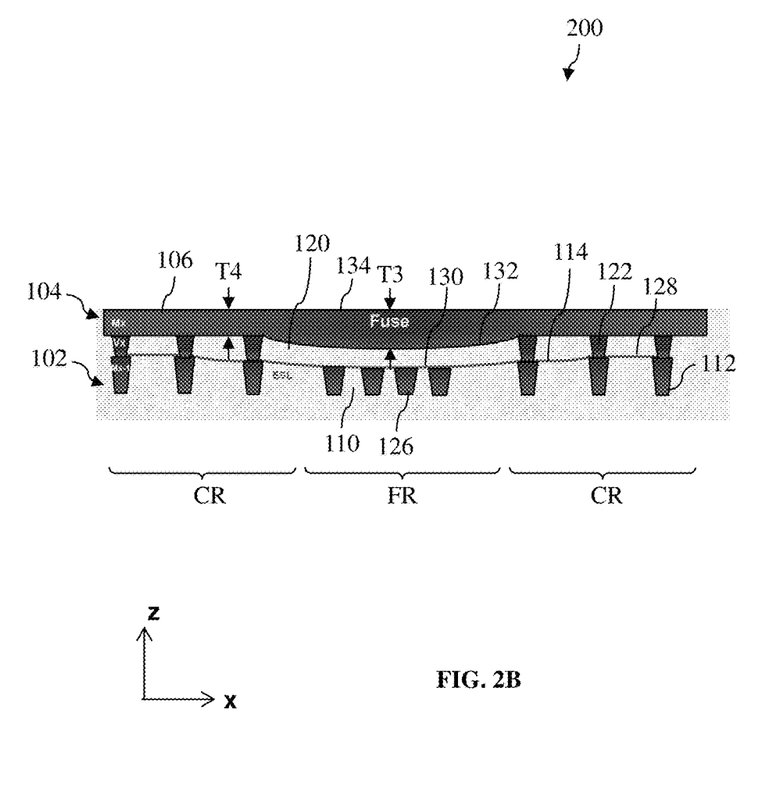
FIG. 2B is a section view along line 2B of the e-fuse of FIG. 2A.

As shown in FIG. 2B, the fuse element 106 may have a non-uniform thickness in the z-direction. In some embodiments, as illustrated, a thickness T3 in the fuse region FR is greater than a thickness T4 in the contact regions CR. In some embodiments, the thickness T3 of the fuse element 106 in the semiconductor structure 200 may exceed the thickness T1 of the fuse element 106 in the semiconductor structure 100. In some embodiments, an overall metal thickness of the fuse element 106 is further increased relative to the semiconductor structure 100. In some embodiments, a local metal thickness, such as the thickness T3, may be increased relative to the semiconductor structure 100. In some embodiments, increased overall metal thickness of the fuse element 106 or increased local metal thickness of the fuse element 106 in the fuse region FR provides increased current density and increased current through the fuse region FR otherwise formed semiconductor structure having relatively decreased metal thickness, which may result in easier burn out of the fuse element 106 compared to the semiconductor structure having relatively decreased metal thickness, such as with a concave bottom surface. In some embodiments, the current increased by the fuse element 106 of the semiconductor structure 200 relative to a fuse element of a semiconductor structure formed by an existing method is greater than 25%, or a in a range between 25% and 35%.

In some embodiments as discussed above, the fuse element 106 having the thickness T3 may result from changing underlayer metal environment, such as the Mx-1 layer, compared to conventional practice. As illustrated in FIG. 2B, top surfaces 130 of the dummy pattern metal features 126 and the top surface 130 of first ILD layer 110 in the fuse region FR may be lower in height in the z-direction than top surfaces 128 of the metal features 112 in the contact regions CR. On the other hand, bottom surfaces of the dummy pattern metal features 126 in the fuse region FR and bottom surfaces of the metal features 112 in the contact regions CR may be aligned with each other along the x-direction. In other words, a height in the z-direction of the bottom surfaces of the dummy pattern metal features 126 may be about equal to a height in the z-direction of the bottom surfaces of the metal features 112 in the contact regions CR.

As illustrated in FIG. 2B, the second ILD layer 120 may conform to top surfaces 128, 130 of the metal features 112, the first ILD layer 110, and the dummy pattern metal features 126. Thus, the second ILD layer 120 may form a concave structure at least in the fuse region FR since underlying top surfaces 130 of the dummy pattern metal features 126 and the first ILD layer 110 in the fuse region FR are lower in height than top surfaces 128 of the metal features 112 and the first ILD layer 110 in the contact regions CR. In some embodiments, a height in the z-direction of a top surface 132 of the second ILD layer 120 may decrease from the contact regions CR to at or near a center of the fuse region FR moving along the x-direction. In some embodiments, a height of the top surface 132 of the second ILD layer 120 may decrease gradually, or continuously, as shown.

As illustrated in FIG. 2B, the fuse element 106 may conform to the top surface 132 of the second ILD layer 120. Thus, the fuse element 106 may form a convex bottom surface 132 in contact with the concave top surface 132 of the second ILD layer 120 in the fuse region FR. In some embodiments, a top surface 134 of the fuse element 106 in the fuse region FR may be higher than a top surface of the fuse element 106 in the contact regions CR. In such embodiments, a height of the top surface 134 in the z-direction may increase continuously, such that the thickness T3 of the fuse element 106 may be greatest near a center of the fuse element 106 along the x-direction. In some embodiments, the fuse element 106 may be symmetrical in every direction. In some other embodiments, the top surface 134 of the fuse element 106 may be planar in the x-y plane due to a CMP process applied thereon. However, it will be appreciated that the thickness T3 may still exceed the thickness T4 in the contact regions CR of the semiconductor structure 200 as well as the thickness T1 in the fuse region FR of the semiconductor structure 100.

Figure 3:
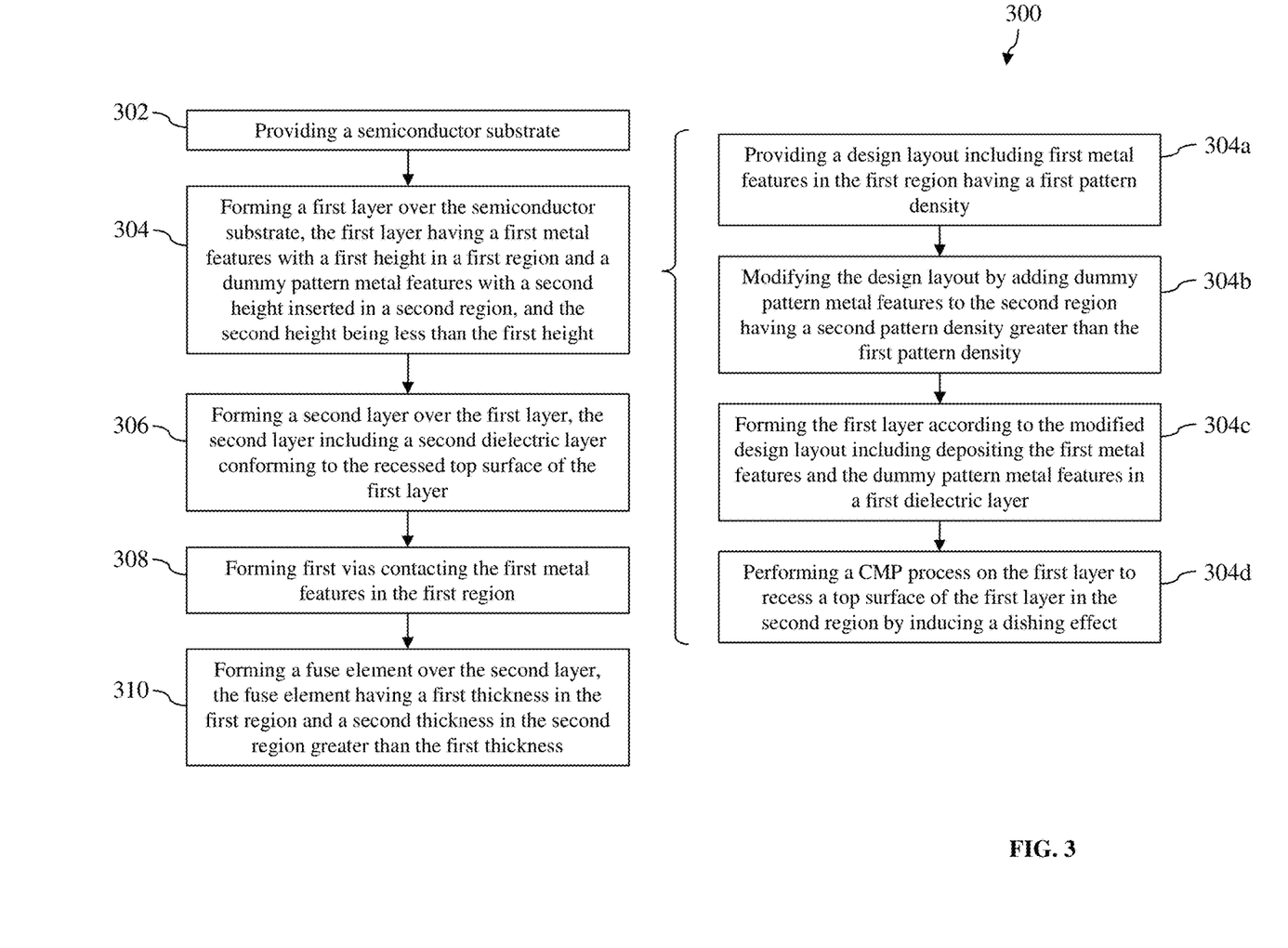
FIG. 3 is a flow chart illustrating a method for fabricating a semiconductor structure in accordance with some embodiments.
Figure 4A:
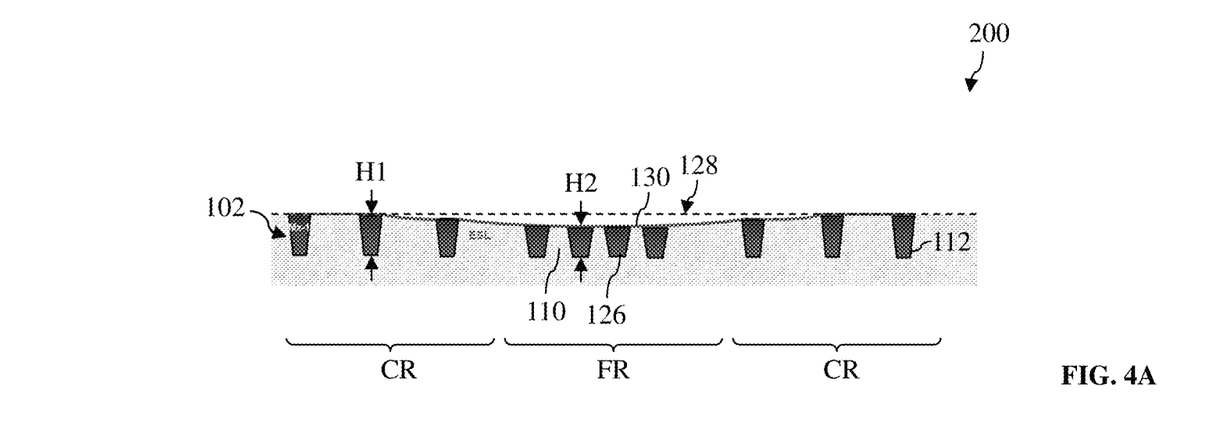
FIGS. 4A-4D are section views of the semiconductor structure of FIG. 2B at various steps during fabrication.

FIG. 3 is a flow chart illustrating a method 300 for fabricating a semiconductor structure 200 in accordance with some embodiments. FIGS. 4A-4D are section views of the semiconductor structure 200 of FIG. 2B at various steps during fabrication. Referring collectively to FIGS. 3 and 4A, the method 300 begins at block 302 by providing a semiconductor substrate. In some embodiments, the semiconductor substrate may be formed before forming the base layer 102. In such embodiments, the semiconductor substrate may be disposed under the base layer 102. At block 304, the method 300 proceeds by forming a first layer 102 (Mx-1 layer) over the semiconductor substrate, the first layer having first metal lines 112 contacting to the contact pads 108 in the contact region CR and dummy pattern metal features in the fuse region FR. When the dummy pattern metal features inserted in the fuse region has a greater duty ratio than that of the metal features 112 in the contact region, such as those illustrated in FIG. 2B, the first layer having a first height H1 in a first region (contact region CR) and a second height H2 in a second region (fuse region FR) less than the first height H1, the first and second heights H1, H2 being measured in the z-direction. A relative height difference (H1-H2)/H1 may range between about 25% and about 35%. In some embodiments, when the dummy pattern metal features inserted in the fuse region has a same duty ratio to that of the metal features 112 in the contact region, such as those illustrated in FIG. 1B, the first and second heights H1, H2 may be about equal to each other.

Block 304 of the method 300 may include various sub-steps including blocks 304a-304d. At block 304a, the method 300 proceeds by providing a design layout including first metal features 112 in the first region CR having a first pattern density. At block 304b, the method 300 proceeds by modifying the design layout by adding dummy pattern metal features 126 to the second region FR having a second pattern density greater than the first pattern density. At block 304c, the method 300 proceeds by forming the first layer 102 according to the modified design layout including depositing the first metal features 112 and the dummy pattern metal features 126 in a first dielectric layer 110. The first layer 102 includes a planar top surface 128. As shown in FIG. 4A, the planar top surface 128 is marked by a dashed line. In some embodiments, the first dielectric layer 110 may be deposited over an underlying layer such as one or more of a semiconductor substrate, contact etch stop layer, inter-layer dielectric layers, conductive layers, and interconnect layers in the semiconductor structure 200. In some embodiments, the first dielectric layer 110 may be bulk deposited followed by patterning and etching to form one or more contact trenches in the contact region CR and one or more dummy trenches in the fuse region FR. Thereafter, the first metal features 112 may be deposited in the contact trenches and the dummy pattern metal features 126 may be deposited in the dummy trenches using PVD, CVD, ALD, electroplating, ELD, or other suitable deposition process, or combinations thereof. In some embodiments, the planar top surface 128 may be formed by performing a CMP step after depositing the first metal features 112 and the dummy pattern metal features 126.

At block 304d, the method 300 proceeds by performing a CMP process on the first layer to recess the top surface 128 of the first layer in the second region FR by inducing a dishing effect to form a recessed top surface 130. In some embodiments, parameters of the CMP process may be selected to increase a dishing effect in the second region FR relative to the first region CR. In some embodiments, each CMP step may use a different CMP process having different process parameters including one or more of differing turn table rotation rate, top ring rotation rate, head down force (or substrate-to-pad force), slurry composition, slurry pH, slurry additives, slurry selectivity, temperature, and polishing time.

In some embodiments, the slurry may be an oxidizing slurry including an oxidant to oxidize the material on the surface to be removed. In some embodiments, the oxidant may include hydrogen peroxide. In some embodiments, the slurry may have an acidic pH (pH<7) for selectively removing acid soluble components. In some other embodiments, the slurry may have a basic pH (pH>7) for selectively removing base soluble components. In some other embodiments, the slurry may have a neutral pH (pH=7). In some embodiments, the slurry may include an additive such as one or more of silica, surfactants, and metal corrosion inhibitors. In some embodiments, the slurry may selectively remove material in the fuse region FR relative to the contact region CR. In some embodiments, the dummy pattern metal features 126 may be recessed to a second height H2 less than the first height H1.

Figure 4B:
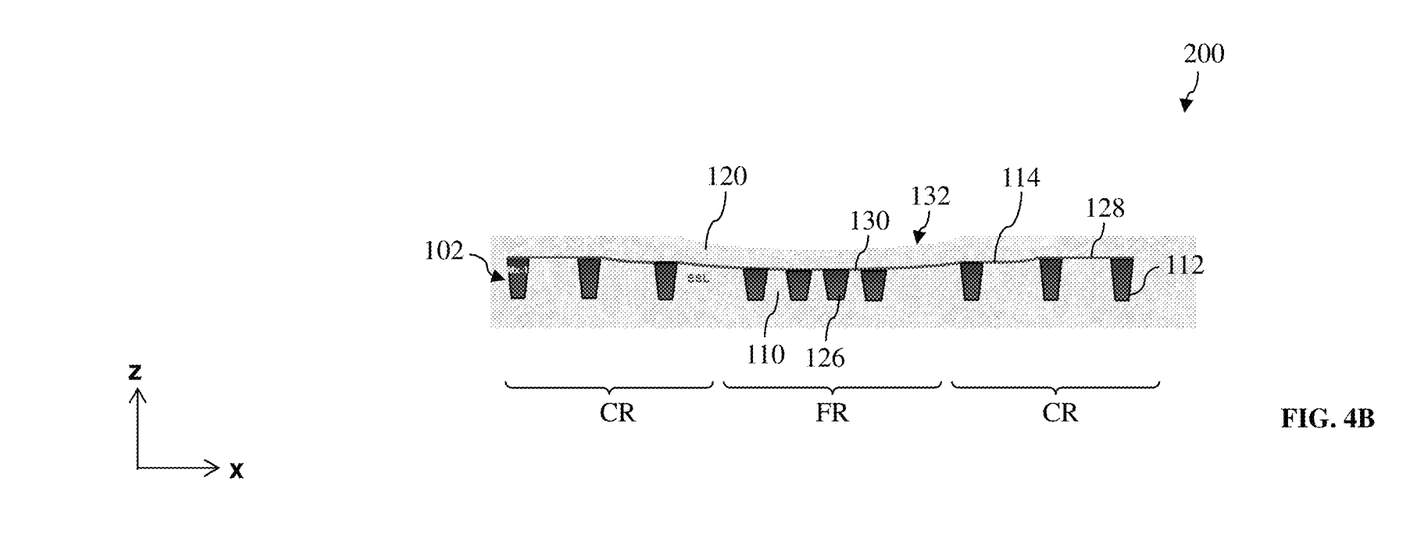

Referring collectively to FIGS. 3 and 4B, at block 306, the method 300 proceeds by forming a second layer (Vx layer) over the first layer 102, the second layer including a second dielectric layer 120 conforming to the recessed top surface 130 of the first layer 102. In some embodiments, the second dielectric layer 120 may be deposited conformally on the top surface 130, so that a profile of the recessed top surface 130 is transferred onto a top surface 132 of the second dielectric layer 120. In some embodiments, an etch stop layer 114 may be deposited before forming the second dielectric layer 120. In such embodiments, the etch stop layer 114 may be deposited conformally on the recessed top surface 130.

Figure 4C:
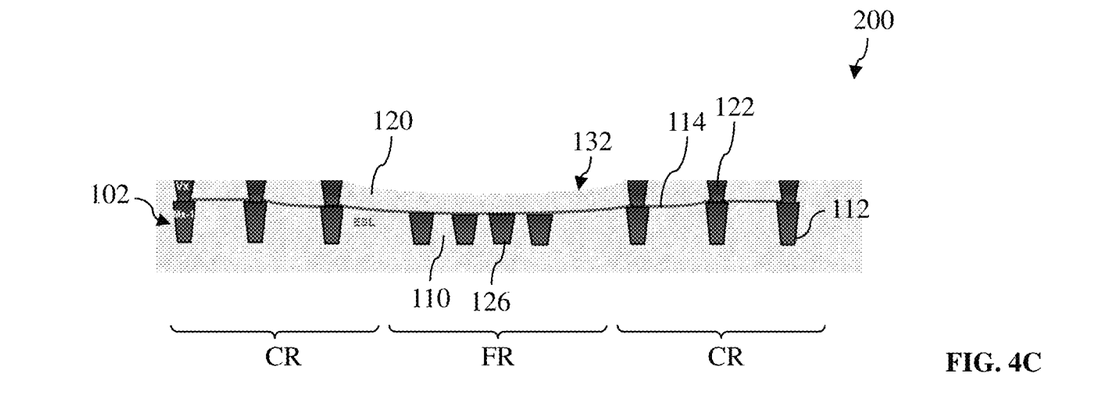

Referring collectively to FIGS. 3 and 4C, at block 308, the method 300 proceeds by forming first vias 122 contacting the first metal features 112 in the first region CR, wherein each first via 122 is in electrical contact with a respective first metal feature 112 and further in electrical contact with an overlying fuse element 106. In some embodiments, the second dielectric layer 120 may be patterned and etched to form one or more via trenches in the contact region CR. Thereafter, a conductive material may be deposited over the second dielectric layer 120 filling the via trenches to form the first vias 122. In some embodiments, the conductive material may be deposited using PVD, CVD, ALD, electroplating, ELD, or other suitable deposition process, or combinations thereof. Thereafter, a CMP process may be applied to remove excess conductive material and to re-expose the top surface 132 of the second dielectric layer 120.

Figure 4D:
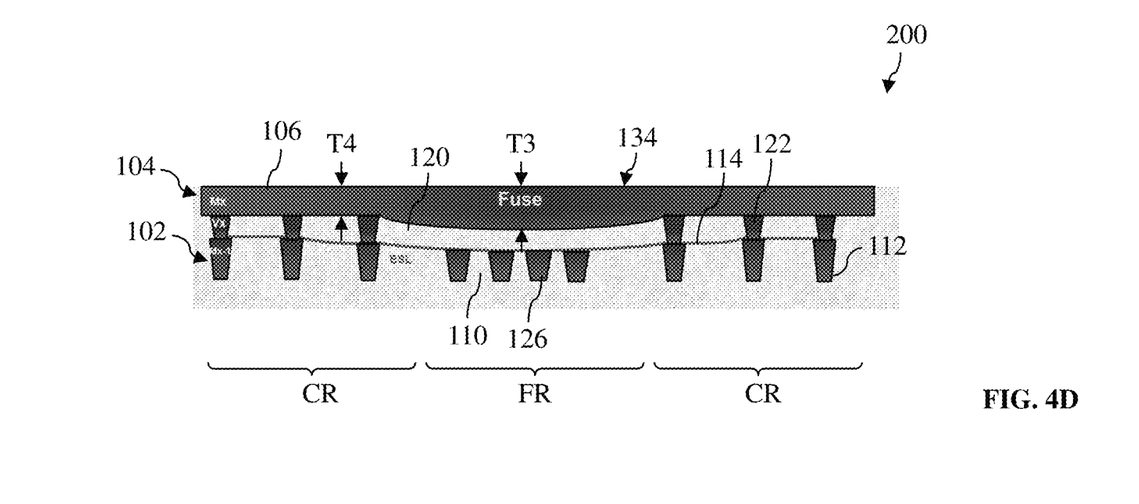

Referring collectively to FIGS. 3 and 4D, at block 310, the method 300 proceeds by forming the fuse element 106 (Mx layer) over the second layer, the fuse element 106 having a first thickness T4 in the first region CR and a second thickness T3 in the second region FR greater than the first thickness T4. In some embodiments, a relative difference between the thicknesses T3 and T4, expressed as (T3-T4)/T4, may range between about 20% and about 30%. In some embodiments, the fuse element 106 may be formed of a metal, such as copper or other suitable metals, or a metal silicide, such as nickel silicide (NiSi), titanium silicide ($TiSi_2$), cobalt silicide ($CoSi_x$), platinum silicide ($PtSi_2$), other suitable metal silicides, or combinations thereof. In some embodiments, the fuse element 106 may be deposited using PVD, CVD, ALD, electroplating, ELD, or other suitable deposition process, or combinations thereof. Thereafter, a CMP process may be applied to a top surface 134 of the fuse element 106 to planarize the top surface 134.

Various embodiments described herein have advantages in electrical fuse implementations. The fuse element 106 having increased thickness, such as the thickness T3, or the thickness T1 in some other embodiments, may provide larger current density at the same program voltage compared to conventional thinner fuse elements. Thus, using the same voltage and without increasing power consumption, larger current density design semiconductor structures 100, 200 may enable the fuse element 106 to blow or burn out more easily on current layout. In some embodiments, the fuse element 106 in the semiconductor structure 200 may burn out at lower program voltage than the fuse element 106 in the semiconductor structure 100. Likewise, the fuse element 106 in the semiconductor structure 100 may burn out at lower program voltage than conventional thinner fuse elements.

In one example aspect, the present disclosure provides a semiconductor structure that includes an Mx-1 layer including a first dielectric layer and first metal features, wherein the first metal features include a first set of first metal features in a first region and a second set of first metal features in a second region, wherein the first set has a first pattern density and the second set has a second pattern density being greater than the first pattern density. The structure further includes a Vx layer disposed over the Mx-1 layer, the Vx layer including first vias contacting the first set of the first metal features. The structure further includes an Mx layer disposed over the Vx layer, the Mx layer including a fuse element, wherein the fuse element has a first thickness in the first region less than a second thickness in the second region.

In another example aspect, the present disclosure provides a method of forming a semiconductor structure. The method includes providing a semiconductor substrate; forming a first layer over the semiconductor substrate that further includes: forming a first dielectric layer; depositing first metal features having a first pattern density in a first region; depositing dummy pattern metal features having a second pattern density in a second region, wherein the second pattern density is greater than the first pattern density; and performing a chemical mechanical polishing (CMP) process on the first layer to recess a top surface of the first layer in the second region such that a first height of the first layer in the first region is greater than a second height of the first layer in the second region; and forming a fuse element over the first layer, the fuse element including a first thickness in the first region less than a second thickness in the second region.

In yet another example aspect, the present disclosure provides a semiconductor structure that includes a semiconductor substrate; a fuse region formed over the semiconductor substrate, the fuse region including a plurality of dummy pattern metal features having a first pattern density; a contact region formed over the semiconductor substrate adjacent the fuse region, the contact region including a plurality of metal features having a second pattern density less than the first pattern density; and a fuse element formed in the fuse region and the contact region, wherein a first thickness of the fuse element in the fuse region is greater than a second thickness of the fuse element in the contact region.

Although these embodiments and their advantages have been described in detail, it will be appreciated that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a substrate having a normal direction perpendicular to a top surface of the substrate;
   an Mx-1 layer including a first dielectric layer and first metal features, wherein the first metal features include a first set of first metal features in a first region and a second set of first metal features in a second region spaced from the first region along a first direction, wherein the first set of the first metal features has a first pattern density and the second set of the first metal features has a second pattern density being greater than the first pattern density;
   a Vx layer disposed over the Mx-1 layer, the Vx layer including first vias contacting the first set of the first metal features; and
   an Mx layer disposed over the Vx layer, the Mx layer including a fuse element, wherein the fuse element has a first thickness in the first region less than a second thickness in the second region, wherein the first thickness and the second thickness are measured along the normal direction.

2. The semiconductor structure of claim 1, wherein the Mx-1 layer further comprises a third set of first metal features in a third region, wherein the first, second, and third sets of the first metal features are aligned along the first direction, and wherein the first and third regions are interposed by the second region along the first direction.

3. The semiconductor structure of claim 2, wherein the Vx layer further comprises second vias contacting the third set of the first metal features.

4. The semiconductor structure of claim 3, wherein the fuse element extends lengthwise in the first direction, and wherein the fuse element contacts each of the first and second vias.

5. The semiconductor structure of claim 4, wherein, along a second direction perpendicular to the first direction, the fuse element has a first width in the first and third regions greater than a second width in the second region.

6. The semiconductor structure of claim 5, wherein the first metal features of the Mx-1 layer further include a first and second dummy metal features disposed in the first region and symmetrically configured on opposite sides of the fuse element.

7. The semiconductor structure of claim 6, wherein the first and second dummy metal features and the fuse element are configured in a same level along the normal a third direction perpendicular to the first and second directions.

8. The semiconductor structure of claim 7, wherein the first and second dummy metal features and the fuse element are same in composition and different in size.

9. The semiconductor structure of claim 6, wherein the first metal features of the Mx-1 layer further include a third and fourth dummy metal features disposed in the third region and symmetrically configured on opposite sides of the fuse element.

10. The semiconductor structure of claim 1, wherein each first metal feature of the first set has a first dimension in the first direction and each second metal feature of the second set has a second dimension in the first direction greater than the first dimension.

11. The semiconductor structure of claim 1, wherein the first set of the first metal features has a first duty ratio and the second set of the first metal features has a second duty ratio greater than the first duty ratio.

12. A semiconductor structure comprising:
    an Mx-1 layer including a first dielectric layer and first metal features, wherein the first metal features include a first set of first metal features in a first region, a second set of first metal features in a second region, and a third set of first metal features in a third region, wherein the first, second and third sets of first metal features are aligned along a first direction, wherein the second set of first metal features is interposed between the first and third subsets of first metal features, wherein the first and third sets of the first metal features have a first pattern density and the second set of the first metal features has a second pattern density being greater than the first pattern density;
    a Vx layer disposed over the Mx-1 layer, the Vx layer including first vias contacting the first set of the first metal features and second vias contacting the third set of the first metal features; and
    an Mx layer disposed over the Vx layer, the Mx layer including a fuse element, wherein the fuse element has a first thickness in the first region less than a second thickness in the second region, wherein a bottom surface of the fuse element in the fuse region is convex.

13. The semiconductor structure of claim 12, wherein the fuse element extends lengthwise in the first direction from the first region to the third region, and wherein the fuse element contacts each of the first and second vias.

14. The semiconductor structure of claim 13, wherein each first metal feature of the first set has a first dimension in the first direction and each second metal feature of the second set has a second dimension in the first direction greater than the first dimension.

15. The semiconductor structure of claim 14, wherein
    the first set of the first metal features has a first duty ratio and the second set of the first metal features has a second duty ratio greater than the first duty ratio; and
    each first metal feature of the first set has a first dimension in the first direction and each second metal feature of the second set has a second dimension in the first direction greater than the first dimension.

16. The semiconductor structure of claim 12, wherein, along a second direction perpendicular to the first direction, the fuse element has a first width in the first and third regions greater than a second width in the second region.

17. A semiconductor structure comprising:
    a semiconductor substrate having a normal direction perpendicular to a top surface of the semiconductor substrate;
    a fuse region formed over the semiconductor substrate, the fuse region including a plurality of dummy pattern metal features having a first pattern density;
    a contact region formed over the semiconductor substrate adjacent the fuse region, the contact region including a plurality of metal features having a second pattern density less than the first pattern density; and
    a fuse element formed in the fuse region and the contact region, wherein a first thickness of the fuse element in the fuse region is greater than a second thickness of the fuse element in the contact region, wherein the first thickness and the second thickness are measured along the normal direction.

18. The semiconductor structure of claim 17, further comprising a plurality of vias disposed between the plurality of metal features and the fuse element, each via being in electrical contact with a metal feature of the plurality of metal features.

19. The semiconductor structure of claim 17, wherein the fuse region has a first duty ratio and the contact region has a second duty ratio less than the first duty ratio.

20. The semiconductor structure of claim 17, wherein a bottom surface of the fuse element in the fuse region is convex.

\* \* \* \* \*